United States Patent [19]

Patel

[11] Patent Number: 5,543,655

[45] Date of Patent: Aug. 6, 1996

[54] TRANSISTOR STRUCTURE FOR IMPROVED BASE–COLLECTOR JUNCTION CHARACTERISTICS

[75] Inventor: Viren C. Patel, Belle Mead, N.J.

[73] Assignee: SGS-Thomson Microelectronics, Inc., Carrollton, Tex.

[21] Appl. No.: 350,611

[22] Filed: Jun. 9, 1994

Related U.S. Application Data

[63] Continuation of Ser. No. 994,356, Dec. 21, 1992, abandoned.

[51] Int. Cl.⁶ .......................... H01L 29/73; H01L 29/861
[52] U.S. Cl. .......................... 257/514; 257/586; 257/592; 257/653; 257/657
[58] Field of Search .................... 257/586, 592, 257/593, 603, 653, 657, 513–515, 511, 496, 545, 552, 558

[56] References Cited

U.S. PATENT DOCUMENTS

| 4,165,516 | 8/1979 | Smulders | 357/34 |
| 4,805,004 | 2/1989 | Gandolfi et al. | 257/592 |

FOREIGN PATENT DOCUMENTS

| 2447306 | 4/1975 | Germany | 257/586 |
| 44-15500 | 7/1969 | Japan | 257/586 |
| 45-37363 | 11/1970 | Japan | 257/586 |
| 56-30756 | 3/1981 | Japan | 257/586 |
| 1-223766 | 9/1989 | Japan | 257/592 |

OTHER PUBLICATIONS

Translation of EPO Application #0 519 268 A3, published Dec. 23, 1992, Brostroem et al.
Translation of German Patent #2 930 460, published Jan. 29, 1981, Ressel.
Translation of German Patent #2 745 300 A1, published Apr. 13, 1978, Misawa et al.
Translation of French Patent No. 2 173 729, published Oct. 12, 1973.
Translation of Japan Kokai Publication #01–0223766 to Scimizu, 257/586, 14 pages.

*Primary Examiner*—Peter Toby Brown
*Attorney, Agent, or Firm*—Renee M. Larson; Lisa K. Jorgenson

[57] ABSTRACT

The present invention is directed to an improved base-collector junction transistor structure capable of higher junction breakdown voltages and lower junction capacitances than bipolar transistors of the prior art. A narrow trench is used to positively affect junction breakdown voltage and junction capacitance. The trench allows the beneficial characteristics of both depletion ring and mesa structures to be utilized. Depletion zone profiles that negatively affect junction breakdown voltage are minimized by using the trench and a depletion enhancing channel.

16 Claims, 2 Drawing Sheets

TRANSISTOR STRUCTURE FOR IMPROVED BASE–COLLECTOR JUNCTION CHARACTERISTICS

This is a Continuation of application Ser. No. 07/994,356, filed Dec. 21, 1992, now abandoned.

BACKGROUND OF THE INVENTION

1. Field of the Invention

The present invention relates generally to transistors, and more specifically to a bipolar transistor structure for improved junction breakdown voltage and junction capacitance characteristics.

2. Description of the Prior Art

For designers of bipolar transistors which are expected to generate power gain, it is important that transistor design address both higher voltage and current requirements. Devices which generate high power gain, such as Microwave and RF power transistors, must possess higher voltage and current capabilities than those transistors which do not provide power amplification.

In order to achieve optimal transistor power gain, the correct balance between several electrical parameters must be found. The proper voltage and current values must be found. Increasing the resistivity increases the voltage level which may be achieved, but at the same time decreases the current value. Therefore, the correct balance between the lowest possible resistivity and the highest possible breakdown voltage must be achieved. In addition, other electrical characteristics such as base-collector capacitance must be minimized.

Under reverse bias conditions, the transistor's base-collector junction breakdown voltage value may be adversely affected. Defects and impurities on the silicon crystal surface where the base-collector junction meets the surface of the crystal conspire to lower the junction breakdown voltage. The high breakdown voltage characteristic of bulk silicon is not achievable. Because of the nature of diffused junctions, especially shallow junctions, typically about 40% of the bulk breakdown voltage can be obtained.

In order to enhance the junction breakdown voltage for a given resistivity level, physical structures such as depletion rings and mesas have been used. These structures successfully enhance breakdown voltages when used in conjunction with appropriate etching, washing, and heating techniques in suitable environments. The surface structure is often stabilized through passivation with oxide or nitride.

Physical structures work to minimize surface effects, but do possess undesirable characteristics. Depletion rings, single and multiple concentric, are beneficial in that higher junction breakdown voltages may be obtained. However, the addition of each depletion ring adds to junction capacitance, an undesirable parameter to RF and microwave performance. The larger the area attributed to depletion rings, the higher the junction capacitance, all other parameters being equal.

Mesa structures do not employ depletion rings; therefore, no significant junction capacitance is added as a result of using mesa structures. However, the base-collector junction still protrudes into the crystal silicon surface, causing only moderate junction breakdown voltages to be achieved.

SUMMARY OF THE INVENTION

It is therefore an object of this invention to provide a base-collector junction transistor structure which enhances the junction breakdown voltage that may be achieved for a given resistivity value.

It is further an object of this invention to provide a base-collector junction transistor structure which minimizes surface phenomenon-limited junction breakdown voltage under reverse bias conditions.

It is further an object of this invention to provide a base-collector junction transistor structure which utilizes the best characteristics of depletion ring and mesa physical structures.

It is further an object of this invention to provide a base-collector junction transistor structure which minimizes the base-collector junction capacitance.

The present invention is directed to an improved base-collector junction transistor structure capable of higher junction breakdown voltages and lower junction capacitances than bipolar transistors of the prior art. A narrow trench is used to positively affect junction breakdown voltage and junction capacitance. The trench allows the beneficial characteristics of both depletion ring and mesa structures to be utilized. Depletion zone profiles that negatively affect junction breakdown voltage are minimized by using the trench and a depletion enhancing channel.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
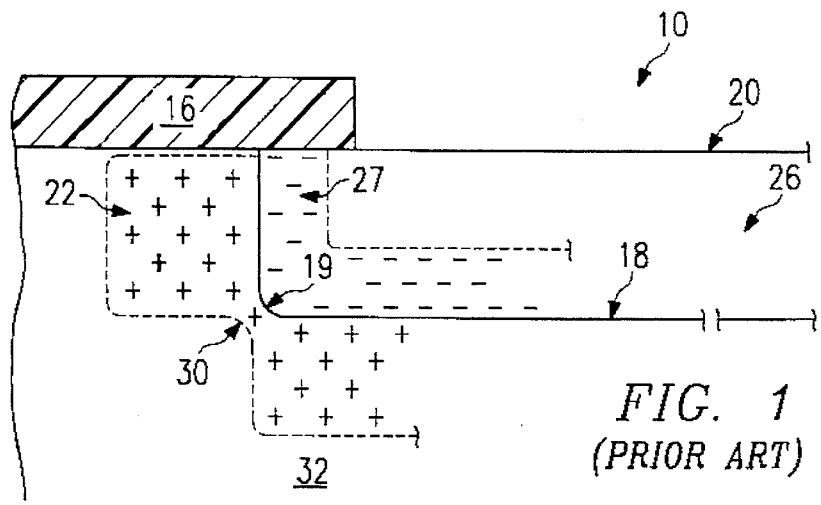
FIG. 1 is a base-collector junction of a bipolar transistor structure according to the prior art.

FIG. 1 shows detail of base collector junction 18 of bipolar transistor structure 10 according to prior art. Silicon surface 20 is partially covered by oxide layer 16. Under reverse bias conditions, depletion regions 22 and 27 extend into N region 32 and P⁺ region 26, respectively. The spherical and/or cylindrical portion 19 of base collector junction 18 has a higher field intensity. The charge distribution at the curvature in P region 26 is lower and hence, to maintain charge neutrality, the depletion at 30 in N region 32 is significantly reduced in proportion to the radius of curvature as compared to the planar regions of base collector junction 18 where it is proportionally higher or maximized.

Figure 2:
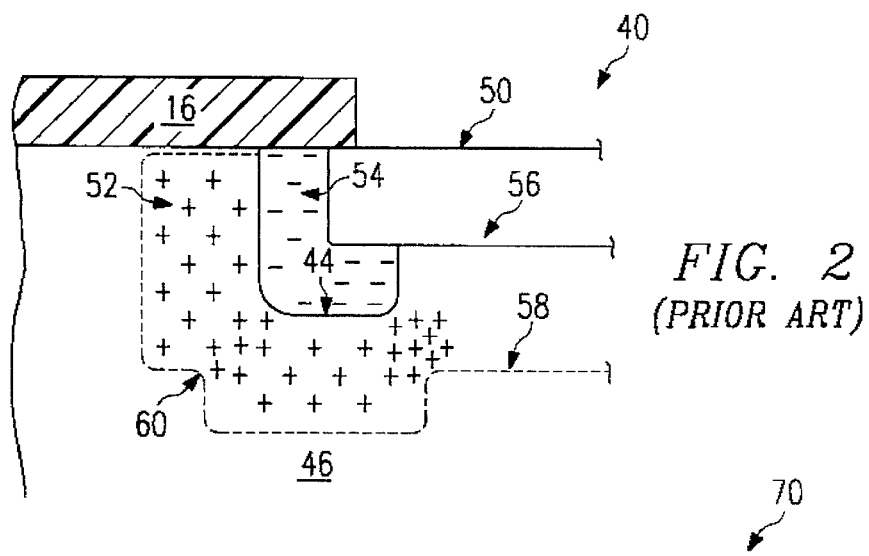
FIG. 2 is a base-collector junction having a depletion ring of a bipolar transistor structure according to the prior art.

Referring now to FIG. 2, base-collector junction 44, having a depletion ring, of bipolar transistor structure 40 according to the prior art is shown. P⁺ region 56 and N region 46 are the base and collector of the transistor, respectively. N region 46 is separated from P⁻ region 54 by PN junction 44. Depletion regions extend on either side of PN junction 44. Region 52 is the depletion zone into N region 46 and is bounded by boundary 58.

The distance between the border of N depletion region 52 and PN junction 44 at point 60 is much larger than the distance between point 30 and base-collector junction 18 of FIG. 1. A benefit of large depletion region 52 is that them is a low electrical field having correspondingly favorable charge distribution at point 60 and reduced chance of premature voltage breakdown. Therefore, a higher junction breakdown voltage is attained. Also, junction breakdown, though higher than in FIG. 1, is limited by the positive radius of curvature shown in FIG. 2.

However, in spite of the beneficial junction breakdown voltage which may be achieved, there are negative effects of the depletion ring structure shown in FIG. 2. The addition of separate P⁻ region 54 into N region 46 makes the effective base size of the transistor equal to the sum of P⁻ region 54 and P⁺ region 56. As the transistor base becomes larger, the capacitance of PN junction 44 increases proportionately. The protrusion of PN junction 44 into surface 50 causes undesired surface effects which also serve to minimize junction breakdown voltage.

Figure 3A:
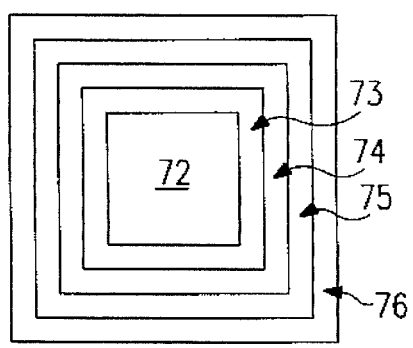
FIG. 3a is a top view of a base-collector junction having non-contacting depletion rings of a bipolar transistor structure according to the prior art.

Two depletion ring transistor structures are commonly used: the non-contacting depletion ring and the contacting depletion ring. FIG. 3a shows a top view 70 of a base-collector junction having non-contacting depletion rings according to the prior art. P+ transistor base 72 is surrounded by two P⁺ non-contacting depletion rings 74 and 76. Base 72 is separated from depletion ring 74 by N silicon ring 73, and rings 74 and 76 are separated by another silicon ring 75. The depletion rings may be the same impurity concentration as the base, as described above, or they may be of a different impurity concentration.

The effective area of the transistor base is equal to base 72 plus rings 73, 74, 75, and 76. A benefit of the depletion ring structure is that the depletion zone is larger, and junction breakdown voltage is obviously enhanced. There are, however, several detriments to using the non-contacting depletion rings shown in FIG. 3a. The addition of extra rings about base 72 of the transistor means that a lot more space is used depending on the width of the rings. In designs where surface area is at a premium, this can be a disadvantage. Also, the junction breakdown voltage which is achievable may be insignificant. Finally, the enlargement of the transistor base means that the junction capacitance is also much larger.

Figure 3B:
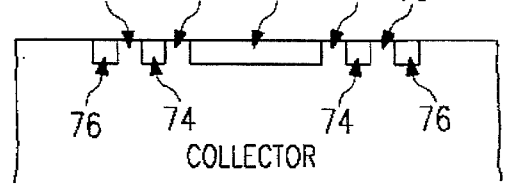
FIG. 3b is a cross-sectional view of a base-collector junction having non-contacting depletion rings of a bipolar transistor structure according to the prior art.

FIG. 3b is a cross-sectional view of a base-collector junction with non-contacting depletion rings shown in FIG. 3a. Base 72 is surrounded by N silicon ring 73 onto which is added P⁺ depletion ring 74. Rings 74 and 76 are separated by a second N silicon ring 75. The addition of rings increases the size of the transistor base to equal the combined widths of 72, 73, 74, 75, and 76.

Figure 4A:
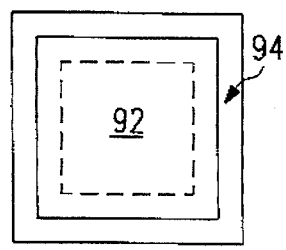
FIG. 4a is a top view of a base-collector junction having contacting depletion rings of a bipolar transistor structure according to the prior art.
Figure 4B:
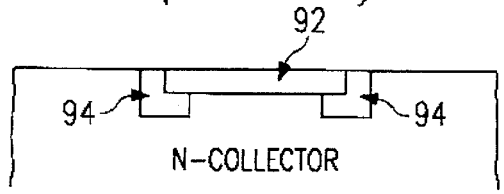
FIG. 4b is a cross-sectional view of a base-collector junction having contacting depletion rings of bipolar transistor structure according to the prior art.

FIG. 4a is a top view 90 of a base-collector junction having contacting depletion rings according to the prior art. P⁺ base region 92 is surrounded by P⁻ depletion ring 94; P⁻ depletion ring also is located under the perimeter of 92 as indicated by the dashed lines. FIG. 4b illustrates a cross-sectional view of the base-collector junction shown in FIG. 4a. The perimeter of P⁺ base region 92 is supported by P⁻ depletion ring 94. The contacting depletion ring offers the advantage of increasing the depletion region similar to the non-contacting depletion ring structure of FIGS. 3a and 3b. However, it allows rings to be added without consuming as much space as was done in FIGS. 3a and 3b. This is accomplished by placing a portion of the depletion ring under the transistor base. In spite of space savings, the contacting ring structure still has the disadvantage of added junction capacitance, and the junction breakdown, though somewhat enhanced, is still cylindrical and/or spherical junction limited.

Figure 5:
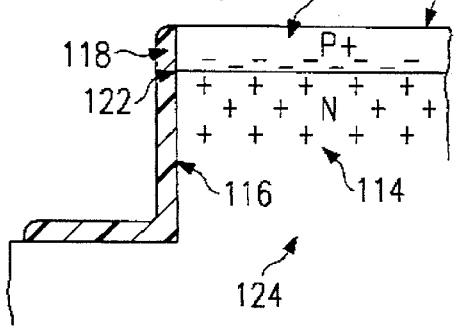
FIG. 5 is a mesa base-collector junction of a bipolar transistor structure according to the prior art.

Referring now to FIG. 5, a mesa base-collector junction of transistor structure 110 according to the prior art is shown. The mesa structure is different from the depletion ring structure in that this structure has no cylindrical and/or spherical regions, therefore P⁻ material is not required to buffer the cylindrical and/or spherical base regions from the collector of the transistor in the mesa structure. P⁺ base region 112 rests on N collector region 114. N region 114 rests on bulk silicon substrate region 124. Sidewall 116 is covered with oxide 118. The fact that no P⁻ material is added to the base means that base region 112 stays the same size and junction capacitance is not increased. This is a benefit of using a mesa structure.

Another difference between the mesa and the depletion ring structures is that the mesa structure does not have a radius of curvature either towards or away from silicon surface 120. Thus depletion region 114 is not enlarged or made smaller. At triple interface point 122, oxide 118, P⁺ material 112 and N material 114 meet on the surface. Under reverse bias conditions, a large electrical field forms in oxide 118, especially at triple interface point 122, and causes premature junction voltage breakdown. This surface phenomenon does not permit near-bulk breakdown voltages to be realized.

Figure 6:
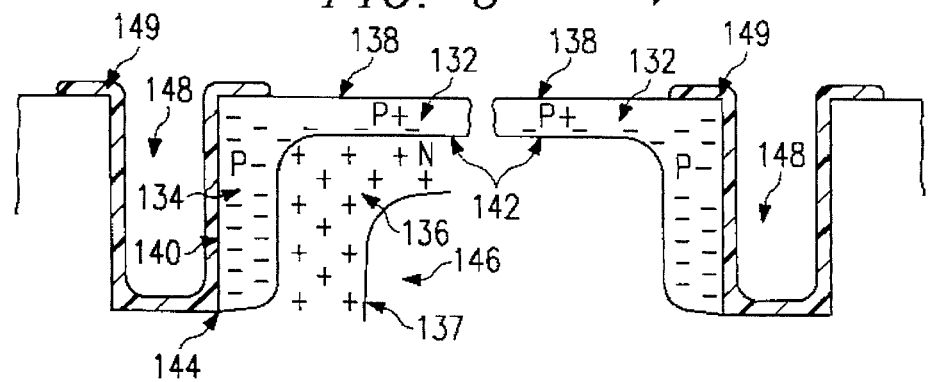
FIG. 6 is a base-collector junction of a bipolar transistor structure according to the present invention.

The present invention addresses cylindrical and/or spherical regions and surface phenomenon limited junction breakdown voltage and the junction capacitance associated with depletion ring and mesa structures of the prior art. FIG. 6 shows transistor structure 130 according to the present invention. Below silicon surface 138, P⁺ base region 132 contains P⁻ depletion zone enhancing channel 134 which shifts N collector depletion region away from PN junction 142 towards bulk silicon region 146. P⁻ depletion zone enhancing channel 134 isolates PN junction 142 from surface 138 and reverses the cylindrical and/or spherical curvature of PN junction 142. Depletion boundary 137 in the N region, instead of being reduced as is shown at point 30 in FIG. 1 and point 60 in FIG. 2, is maximized. Thus, the invention eliminates curvature limited breakdown.

P⁻ depletion zone enhancing channel 134 abuts sidewall 140 which can be one and/or both sides and/or the bottom of narrow trench 148. Trench 148 has a layer of oxide/nitride passivation 149 over it. It provides a way of utilizing the P⁻ region without substantially increasing junction capacitance. The P⁻ region is physically beneath the P⁺ layer and the increase in junction area is significantly less; an added side benefit is that space is conserved, more so than with depletion ring structures. Since depletion channel 134 can be smaller than the typical depletion ring by 30% to 50%, less space is used and junction capacitance is not significantly increased.

The addition of P⁻ region 134 along sidewall 140 of narrow trench 148 reverses the angle of curvature of the cylindrical and/or spherical portion of the PN junction to create a favorable condition in depletion zone 136. P⁺N junction 142 has a negative radius of curvature away from P⁺ region 132 towards N region 146. This results in a large depletion zone 136 which provides protection from undesirable effects at cylindrical and/or spherical portions of the P⁺N junction 142. The electrical field in 136 is shifted in the direction of bulk silicon 146 and away from PN junction 142. The transistor is now capable of achieving close to bulk breakdown voltage. The presence of P⁻N⁺ junction 144 as compared to P⁺N junction 142 significantly reduces charge buildup, and therefore has virtually no effect on junction breakdown. Thus, the presence of P⁻ region eliminates surface phenomenon-limited and cylindrical and/or spherical junction-limited breakdown.

Figure 7A:
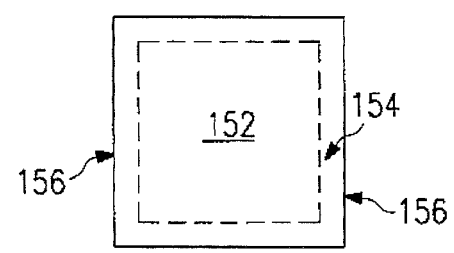
FIG. 7a is a top view of a base-collector junction of a bipolar transistor structure according to the present invention.
Figure 7B:
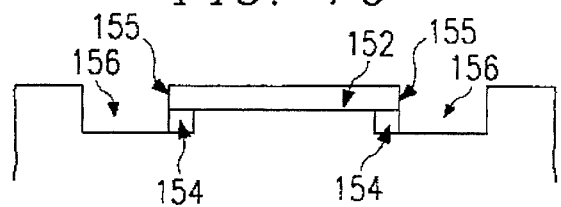
FIG. 7b is a cross,sectional view of a base-collector junction of a transistor structure according to the present invention.

FIG. 7a is a top view 150 of the collector base region of the transistor structure according to the present invention shown in FIG. 6. The perimeter of P⁺ base region 152 rests on top of P⁻ depletion region 154. Two sidewalls 156 abut a narrow trench and provide a vertical barrier which contains P⁺ base region 152 and P⁻ depletion region 154. FIG. 7b shows a cross-sectional view of the transistor structure. The perimeter of P⁺ base region 152 rests on top of P⁻ depletion region 154. Narrow trench 156 abuts sidewall 155 that contains P⁺ base region 152 and P⁻ depletion region 154.

Doping densities for the invention vary. Typical doping density for the collector region ranges from $1\times10^{15}$ to $2\times10^{16}$ atoms/c.c. For typical microwave power transistors, the resistivity may vary from approximately 0.5 to 2.0 ohm-cm.

An advantage shown in FIG. 7b is that resting base region 152 on top of depletion regions 154 does not increase the size of the base area outward, thereby minimizing unwelcome increases in junction capacitance and silicon area used. In the sense that the base area is minimized and the breakdown-limiting cylindrical and/or spherical junction is eliminated, the invention is similar to the mesa structure of FIG. 5. The presence of P⁻ depletion zone enhancing channel 134 in FIG. 6 along sidewall 140 of narrow trench 148 gives PN junction 142 a negative radius of curvature, thereby spreading the depletion region 136 favorably, and bolstering the level of junction breakdown voltage which may be achieved. Finally, the movement of the P⁺N junction away from the surface minimizes the buildup of the high electrical charge which can result in premature junction breakdown voltage.

While the invention has been particularly shown and described with reference to a preferred embodiment, it will be understood by those skilled in the art that various changes in form and detail may be made therein without departing from the spirit and scope of the invention. The structure described herein is also well suited for use in diode structures that require high junction breakdown voltages. Examples of device applications would include IMPATT, MESFET, and MOSFET devices.

Also, it will be understood by one skilled in the art that the doping densities described herein are not the only feasible doping densities which may be used. Additionally, the type of dopant used for either the base or collector regions is not fixed. For ease of explanation, the preferred embodiment discussed a P type base and a N type collector. However, the exact opposite type dopants may be used. It will also be understood that the transistor could be NPN or PNP.

What is claimed is:

1. A base-collector junction transistor structure, comprising:
   a base region, having a relatively shallow junction depth, surrounded by a relatively deep but narrow trench having at least two sidewalls, and having a base depletion channel as deep as the trench, wherein the base region is comprised of a first type dopant material and the base depletion channel is also comprised of the first type dopant material but at a lower concentration than the concentration of the base region;
   a collector region, wherein the collector region is comprised of a second type dopant material, and the first type dopant material and the second type dopant material are opposite dopant types; and
   a base-collector junction connecting the base region and the collector region.

2. The base-collector junction of claim 1, wherein the base depletion channel is located adjacent to the sidewalls.

3. The base-collector junction of claim 2, wherein the base depletion channel creates a radius of curvature of the base-collector junction away from the base region and towards the collector region.

4. The base-collector junction of claim 3, wherein the perimeter of the base region rests on top of the base depletion channel.

5. The base-collector junction of claim 4, wherein the base-collector junction is a P⁺N junction.

6. The base-collector junction of claim 4, wherein the base-collector junction is a N⁺P junction.

7. The base-collector junction of claim 1, wherein the collector region doping density is at least $1\times10^{15}$ but not more than $2\times10^{16}$ atoms/c.c.

8. The base-collector junction of claim 1, wherein the transistor structure is suitable for use in microwave power transistors.

9. A PN junction diode structure, comprising:
   a first polarity region, having a relatively shallow junction depth, surrounded by a relatively deep but narrow trench having at least two sidewalls, and having a depletion channel as deep as the trench, wherein the first polarity region is comprised of a first type dopant material and the depletion channel is also comprised of the first type dopant material but at a lower concentration than the concentration of the first polarity region;
   a second polarity region, wherein the second polarity region is comprised of a second type dopant material, and the first type dopant material and the second type dopant material are opposite dopant types; and
   a diode junction connecting the first polarity region and the second polarity region.

10. The PN junction of claim 9, wherein the depletion channel is located adjacent to the sidewalls.

11. The PN junction of claim 10, wherein the depletion channel creates a radius of curvature of the diode junction away from the first polarity region and towards the second polarity region.

12. The PN junction of claim 11, wherein the perimeter of the first polarity region rests on top of the depletion channel.

13. The PN junction of claim 12, wherein the diode junction is a P⁺N junction.

14. The PN junction of claim 12, wherein the diode junction is a N⁺P junction.

15. The PN junction of claim 9, wherein the second polarity region doping density is at least $1\times10^{15}$ but not more than $2\times10^{16}$ atoms/c.c.

16. The PN junction of claim 9, wherein the PN junction diode structure is suitable for use in IMPATT, MESFET, and MOSFET devices.

\* \* \* \* \*